United States Patent
Gurary et al.

(10) Patent No.: US 8,603,248 B2
(45) Date of Patent: Dec. 10, 2013

(54) SYSTEM AND METHOD FOR VARYING WAFER SURFACE TEMPERATURE VIA WAFER-CARRIER TEMPERATURE OFFSET

(75) Inventors: Alex Gurary, Bridgewater, NJ (US); Eric A. Armour, Pennington, NJ (US); Richard Hoffman, Clinton, NJ (US); Jonathan Cruel, Plano, TX (US)

(73) Assignee: Veeco Instruments Inc., Plainview, NY (US)

( * ) Notice: Subject to any disclaimer, the term of this patent is extended or adjusted under 35 U.S.C. 154(b) by 1943 days.

(21) Appl. No.: 11/352,098

(22) Filed: Feb. 10, 2006

(65) Prior Publication Data

US 2007/0186853 A1 Aug. 16, 2007

(51) Int. Cl.
  *C23C 16/00* (2006.01)
(52) U.S. Cl.
  USPC .................................... 118/728; 118/725
(58) Field of Classification Search
  USPC ......... 118/715, 720, 724, 725, 728, 729, 730; 156/345.51, 345.52, 345.53
  See application file for complete search history.

(56) References Cited

U.S. PATENT DOCUMENTS

| | | | |
|---|---|---|---|
| 3,754,110 A | 8/1973 | van Dongen et al. | |
| 3,783,822 A | 1/1974 | Wollam | |
| 3,892,940 A | 7/1975 | Bloem et al. | |
| 4,369,031 A | 1/1983 | Goldman et al. | |
| 4,560,420 A | 12/1985 | Lord | |
| 5,074,017 A * | 12/1991 | Toya et al. | 29/25.01 |
| 5,119,541 A | 6/1992 | Ohmi et al. | |
| 5,155,652 A | 10/1992 | Logan et al. | |
| 5,242,501 A | 9/1993 | McDiarmid | |
| 5,370,739 A | 12/1994 | Foster et al. | |
| 5,384,008 A | 1/1995 | Sinha et al. | |
| 5,403,401 A | 4/1995 | Haafkens et al. | |
| 5,456,757 A | 10/1995 | Aruga et al. | |
| 5,514,439 A | 5/1996 | Sibley | |
| 5,532,190 A | 7/1996 | Goodyear et al. | |
| 5,551,983 A * | 9/1996 | Shepard et al. | 118/723 R |
| 5,683,606 A | 11/1997 | Ushikoshi et al. | |

(Continued)

FOREIGN PATENT DOCUMENTS

| | | |
|---|---|---|
| CN | 1489644 A | 4/2004 |
| JP | 05230673 A | 9/1993 |

(Continued)

OTHER PUBLICATIONS

Marks' Standard Handbook for Mechanical Engineers, Tenth Edition, McGraw Hill, pp. 4-80-4-84 (1996).

(Continued)

*Primary Examiner* — Maureen Gramaglia
(74) *Attorney, Agent, or Firm* — Lerner, David, Littenberg, Krumholz & Mentlik, LLP

(57) ABSTRACT

A system and method for evenly heating a substrate placed in a wafer carrier used in wafer treatment systems such as chemical vapor deposition reactors, wherein a first pattern of wafer compartments is provided on the top of the wafer carrier, such as one or more rings of wafer carriers, and a second pattern of inlaid material dissimilar to the wafer carrier material is inlaid on the bottom of the wafer carrier, and the second pattern of inlaid material is substantially the opposite of the first pattern of wafer compartments, such that there are at least as many material interfaces in intermediate regions without wafer compartments as there are in wafer carrying regions with wafers and wafer compartments.

44 Claims, 9 Drawing Sheets

(56) References Cited

U.S. PATENT DOCUMENTS

| | | |
|---|---|---|
| 5,683,759 A | 11/1997 | Shepard, Jr. et al. |
| 5,761,023 A | 6/1998 | Lue et al. |
| 5,800,622 A | 9/1998 | Takemi et al. |
| 5,837,058 A | 11/1998 | Chen et al. |
| 5,909,355 A | 6/1999 | Parkhe |
| 6,001,183 A * | 12/1999 | Gurary et al. ............... 118/720 |
| 6,454,865 B1 | 9/2002 | Goodman et al. |
| 6,510,172 B1 | 1/2003 | Miller |
| 6,669,988 B2 | 12/2003 | Daws et al. |
| 6,729,875 B2 | 5/2004 | Goodman |
| 2002/0106826 A1 | 8/2002 | Boguslavskiy et al. |
| 2003/0114016 A1 | 6/2003 | Tischler |
| 2005/0118450 A1* | 6/2005 | Fujii et al. ............... 428/621 |
| 2006/0076108 A1* | 4/2006 | Holland et al. ........... 156/345.27 |

FOREIGN PATENT DOCUMENTS

| | | |
|---|---|---|
| JP | 11162698 A | 6/1999 |
| JP | 03003250 A | 2/2002 |
| JP | 2002057207 A | 2/2002 |
| WO | WO 01/07691 | 2/2001 |

OTHER PUBLICATIONS

Office Action from counterpart Japanese application No. 2007-031672 dated Mar. 9, 2012.

Office Action from Chinese Application No. 200710084013.1, dated Sep. 4, 2009.

Office Action from corresponding Taiwanese Application No. 096104280, dated Jan. 25, 2010.

* cited by examiner

SYSTEM AND METHOD FOR VARYING WAFER SURFACE TEMPERATURE VIA WAFER-CARRIER TEMPERATURE OFFSET

BACKGROUND OF THE INVENTION

Uniform heating is important to many industrial applications, including chemical vapor deposition processes as applied to thin substrates such as Si or GaN based wafers. In some chemical vapor deposition systems, one or more wafer substrates are typically placed in a reactor containing a wafer carrier having one or more wafer compartments or wafer pockets. The wafer carrier and wafer substrates are then heated in the reactor, and are subjected to gasses that react near the substrate surface. This reaction results in thin epitaxial material layers developing on the wafer substrate surface, creating a desired crystalline structure thereon. The resulting processed wafers can be used in the production of end products such as, for example, integrated circuits and light emitting diodes.

Compositional uniformity in layers grown on the processed wafers is important to effective wafer growth. For example, some existing substrate processing systems have edge effects at the edge interface between the wafer substrate and the wafer carrier. These edge effects typically are observed after non-uniform heating of the edges of a wafer substrate in the wafer carrier relative to the rest of the wafer substrate. Disadvantageously, edge effects can result in not only non-uniform deposition of epitaxial growth layers on the wafer, but also migration of impurities into parts of the wafer, and even, in some circumstances, warping of the wafer into a "potato-chip" like shape. This can result in reduced wafer yield, reduced wafer quality, and increases in defects and flaws in processed wafers.

This is especially true for deposition processes employing more volatile components such as In, As, P, Mg, Te, Se, S and Zn, among others. These more volatile components may have significant vapor pressure at the temperatures used for growing epitaxial layers on substrate wafers, and may have slightly different gas phase equilibriums over areas of a wafer substrate at slightly different temperatures. Thus, mass transport may occur from one region of the wafer to another due to non-uniform heating of the wafer substrate. Specifically, as a gas flow travels from a hotter region to a slightly cooler region on a wafer, the gas phase in the hotter region may become enriched compared to equilibrium and cause mass transport from one wafer region to another—resulting in a slightly asymmetric increase in composition of the volatile species in the solid phase deposed on the wafer surface in some regions, but not in others. This mass transport from hotter to cooler regions may cause compositional non-uniformity, particularly for substrate materials containing In.

SUMMARY OF THE INVENTION

What is needed is a system and method for uniformly heating a wafer substrate that permits even conduction of heat to all portions of a wafer on a wafer carrier while reducing mass-transport edge effects.

In one aspect, a wafer carrier is provided, comprising: a wafer carrier structure; a first surface composed of a first material of the wafer carrier structure, the first surface including a plurality of inset wafer compartments; a second surface disposed opposite to the first surface on the wafer carrier structure, the second surface including a second material layer interfacing with the first material, the second material different from the first material; and, the second material covering substantially all of the second surface except for those regions of the second surface substantially opposite to the plurality of inset wafer compartments on the first surface.

In one aspect, a wafer carrier is provided, comprising: a wafer carrier structure, a first surface with a first pattern of wafer compartments therein, the first surface composed of a first material of the wafer carrier structure; and, a second surface disposed opposite to the first surface on the wafer carrier structure, the second surface having a second pattern of second material disposed therein, where the second pattern of second material is substantially the reverse of the first pattern of wafer compartments.

In another aspect, a chemical vapor deposition reactor is disclosed, comprising: a reactor chamber, the reactor chamber including a set of chamber walls defining an inside and an outside of the chamber, a top and a bottom; a gas head disposed into the reaction chamber for providing gasses to the chamber from at least one external gas source; a heating element disposed within the chamber; a wafer carrier disposed on the susceptor, comprising a first surface with a first pattern of wafer compartments therein, the first surface composed of a first material, a second surface disposed opposite to the first surface, the second surface having a second pattern of inlaid second material disposed therein, where the second pattern of inlaid second material is substantially the reverse of the first pattern of wafer compartments; and, a support upon which the heating element, susceptor, and wafer carrier are disposed within the chamber.

In another aspect, a method of heating a wafer for depositing epitaxial layers thereon is provided, comprising: A method of evenly distributing heat through a wafer carrier, comprising: placing a plurality of wafers in a first pattern of wafer compartments disposed in the top of the wafer carrier; setting the wafer carrier on a susceptor to radiate heat to the wafer carrier, such that the bottom surface of the wafer carrier is in communication with the susceptor, wherein the bottom of the susceptor includes an inlaid radiative material in a second pattern that is substantially the negative of the first pattern; and, heating the susceptor via a heating element, such that the susceptor transmits the heat to the bottom surface of the wafer carrier.

In one aspect, a wafer carrier is disclosed comprising a structure defining oppositely-directed first and second surfaces, the structure including wafer-receiving regions and intermediate regions, the structure being adapted to receive wafers on the first surface in the wafer-receiving regions, the intermediate regions having thermal conductance between the first and second surfaces lower than the thermal conductance between the first and second surfaces of the wafer-receiving regions, wherein the structure includes at least two elements defining at least one thermal interface therebetween in the intermediate regions.

DETAILED DESCRIPTION

Substantial improvement in the uniformity of wafer heating has been found by adjusting the number of interfaces between materials forming the structure of a wafer carrier, such that the interfaces between the wafer carrier and a wafer (where edge effects sometimes occur) are counteracted by additional interfaces within the wafer carrier itself between a first wafer carrier material and a second wafer carrier material in those regions of the wafer carrier where wafer compartments are not present.

Figure 1:
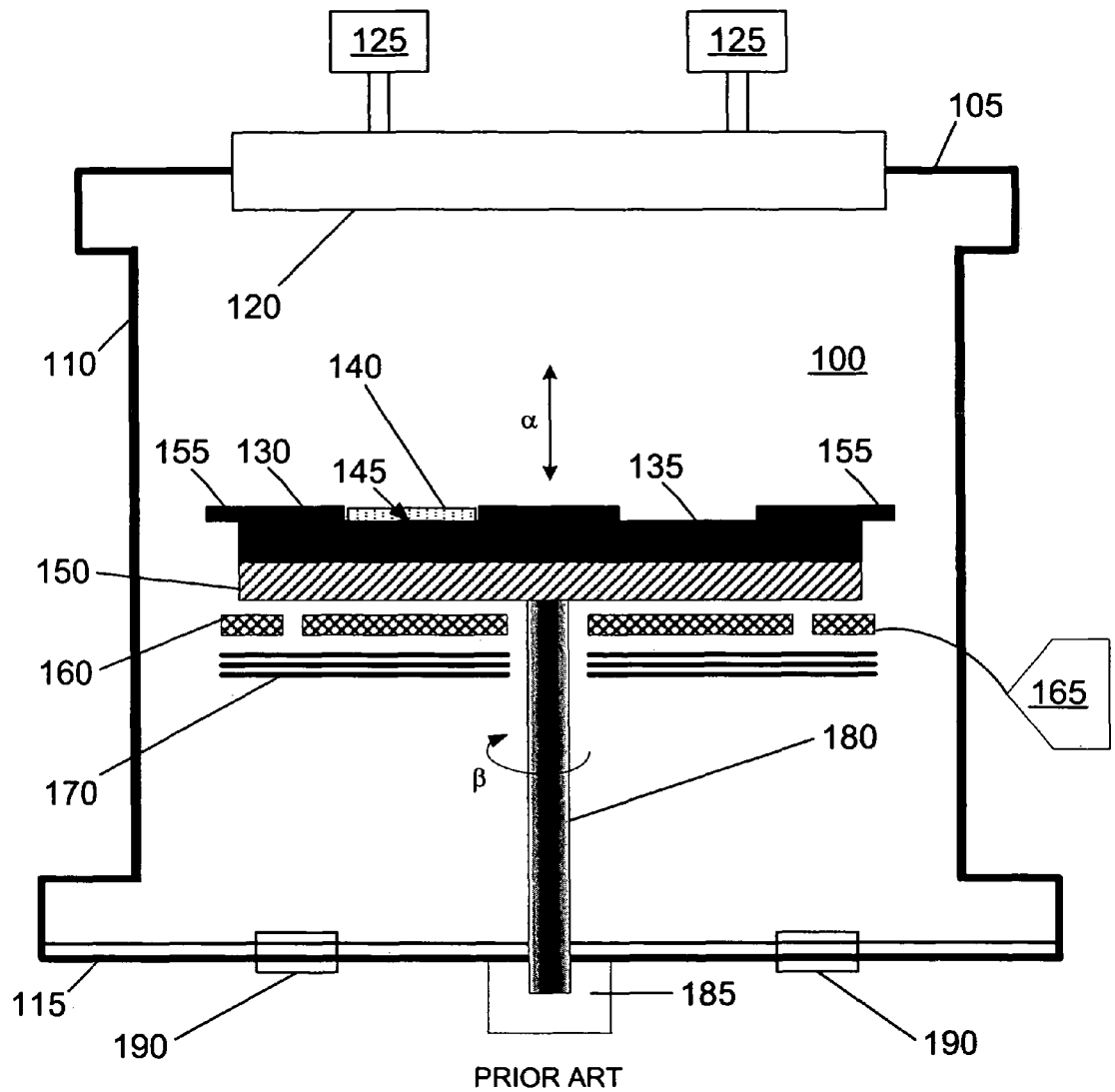
FIG. 1 shows a diagrammatic cross-sectional view of a prior art chemical vapor deposition reactor.

FIG. 1 shows a simplified diagrammatic cross-sectional view of a prior art chemical vapor deposition reactor. A reaction chamber 100 is defined by a chamber top 105, chamber walls 110, chamber bottom 115, and a chamber head or flange 120. The head or flange 120 is coupled to one or more sources of gasses 125 which enter the chamber 100 via the head or flange 120 to participate or assist in the reaction at or near one or more wafer substrates 140 placed in one or more wafer compartments 135 in a wafer carrier 130, where the wafer substrates 140 form an wafer-carrier interface 145 along the surface of the wafer compartments 135. The wafer carrier 130 typically rests atop a susceptor 150, either directly or seated in the susceptor via one or more wafer carrier tabs 155. The susceptor 150 is heated by one or more heating elements 160, which are controlled and/or monitored by a heating elements control circuit 165 of the types well known to those of skill in the art. Adjacent to, and typically below the heating elements, is a heat shield 170.

The wafer substrates 140, wafer carrier 130, and susceptor 150 are held on a spindle 180. In a rotating disc reactor, the spindle 180 rotates at a rotation rate beta ($\beta$) relative to a central axis alpha ($\alpha$) of the reaction chamber 100, via a motor system 185. Gasses leave the reactor via exhaust channels 190.

Figure 2:
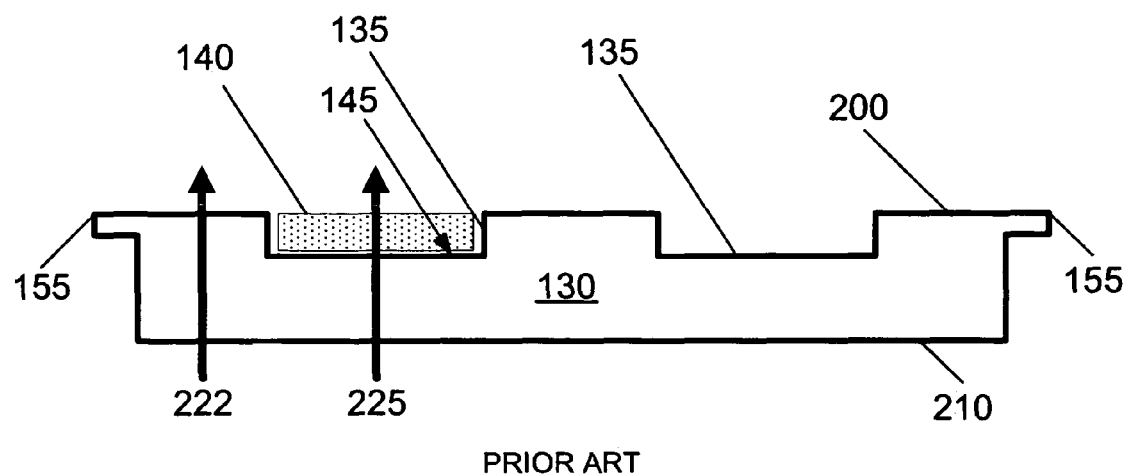
FIG. 2 shows a schematic cross-sectional view of a prior art multiple substrate wafer carrier.

FIG. 2 shows a simplified schematic cross-sectional view of a prior art multiple wafer carrier of a type used in the reactor of FIG. 1. The dimensions of the wafer carrier are not intended to be to scale, but are presented to make individual elements of the carrier representationally clear. Thus, a wafer carrier 130 includes a top surface 200 and a bottom surface 210. On the top wafer carrier surface 200, one or more wafer compartments 135 are provided, in which one or more wafers 140 are placed such that a wafer-carrier interface 145 is created at the boundary between the wafer 140 and the material of the wafer carrier 130 at the wafer compartment 135.

The wafer carrier includes: (1) those regions where there is a wafer compartment, and (2) those regions where there is no wafer compartment. In regions where there is no wafer compartment, a first vertical line 222 normal to the first 200 and second surface 210 of the wafer carrier 130, drawn to bisect the wafer carrier, has no interfaces with any other material. However, in regions where there is a wafer in a wafer compartment, a second vertical bisection line 225 shows an interface 145 between the wafer itself 140 and the wafer carrier 130 at the wafer compartment 135. Thus, there are more interfaces in regions where a wafer compartment exists than in regions where no such wafer compartment exists, and, as a result, the thermal conductivity of heat is thought to be different in each of the resulting regions.

Figure 3A:
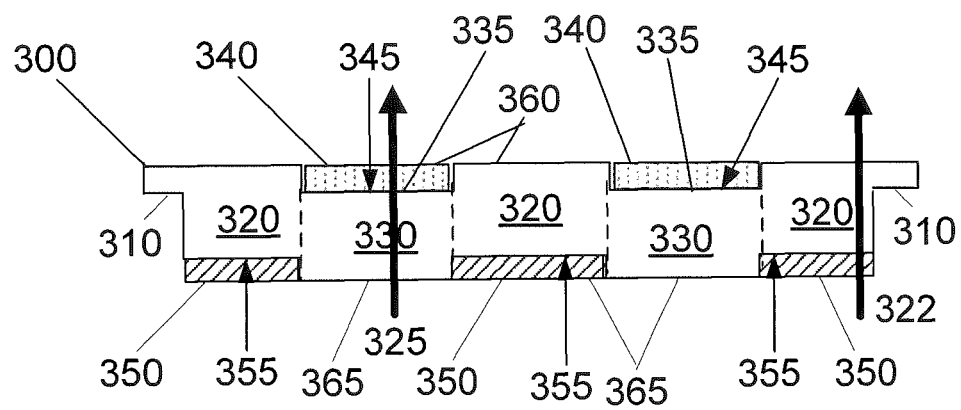
FIG. 3A shows a schematic cross-sectional view of one embodiment of a multiple wafer carrier of the present invention.

FIG. 3A shows a schematic cross-sectional view of one embodiment of a multiple wafer carrier of the present invention. A modified wafer carrier 300 holds one or more wafers 340 in one or more wafer compartments 335. An interface 345 is created between the wafer 340 and the wafer carrier 300 at the wafer compartments 335. The modified wafer carrier 300 may be placed directly or via carrier tabs 310 on or in a susceptor in a chemical vapor reaction chamber such as but not limited to, for example, the chamber of FIG. 1.

The modified wafer carrier 300 includes a top surface 360 and a bottom surface 365, such that the wafer compartments 335 and wafers 340 are in the top surface 360.

The bottom surface 365 of the wafer carrier 300 is modified, however, to include inlaid regions 350 of a distinct material from the wafer carrier material (while an interface between two elements of the same wafer carrier material may be used, a different material than the wafer carrier material is preferred). The inlaid regions 350 are placed inlaid in the bottom surface 365 of the wafer carrier 300 such that they form an inlaid pattern (a second pattern) substantially the negative of the pattern of wafer compartments 335 (a first pattern) found on the top surface 360 of the wafer carrier 300. The first pattern and second pattern are shown in detail in FIGS. 9A and 9B, below. By way of relation to FIGS. 9A and 9B, the cross section shown in FIG. 3 is a cross section of the wafer carrier as shown by the bisection line (Y) shown in FIGS. 9A and 9B.

The inlaid regions 350 are bound, preferably permanently, to the wafer carrier 300 via screwing, welding or another process to form a permanent interface 355 between the inlaid regions 350 and the wafer carrier 300, particularly in regions of the wafer carrier where there is no wafer compartment. In one embodiment, the inlaid regions 350 are screwed to the wafer carrier 300 via screw heads countersunk in the wafer carrier which pass through into tapped holes in the inlaid regions. This interface 355 advantageously forms a conductance barrier between the inlaid region 350 and the wafer carrier 300 in certain regions of the wafer carrier 300 where wafer compartments 335 are not present.

In one embodiment, the wafer carrier 300 is preferably composed of a first material including graphite with glassy surface coating (including, for example, a thin non-porous surface coating to seal graphite porosity at about 12%). A second material, which serves as an inlaid material 350 in the wafer carrier, is preferably Molybdenum or an alloy thereof. In general, all of the components of the wafer carrier 300 and the second material 350 can be made of any number of materials, including for example and without limitation: graphite without coatings or with different surface coatings such as SiC, pyrolitic graphite, FABMATE® (trademark of POCO GRAPHITE); bulk ceramics such as SiC, AlN, $Al_2O_3$ (preferably as obtained by hot pressed or CVD processes); or refractory materials such as Molybdenum, Tungsten, TZM® (trademark of ADVANCED MATERIALS AND DESIGN CORP.); or other alloys or combinations of any of the same, with or without surface coatings.

The wafer carrier 300 can be viewed as containing oppositely-directed first surfaces 360 and second surfaces 365. Furthermore, the wafer carrier can be viewed as divided into wafer-receiving regions 330 and intermediate regions 320. The wafer-receiving regions 330 include those portions of the wafer carrier that include wafer compartments 335 on the first surfaces 360, such that the structure of the wafer carrier adapted to receive wafers 340 on the first surface 360 in the wafer-receiving regions 330.

The intermediate regions 320 include portions of the wafer carrier without wafer compartments 335. The intermediate regions 320 advantageously have a thermal conductivity in the region between the first surfaces 360 and second surfaces 365 lower than the thermal conductance between the first and second surfaces of the wafer-receiving regions 330. Conductance can be defined as the inverse of resistance, for example, and can be measured as a ratio of current to voltage (I/E).

The intermediate regions 320 may include an inlaid region 350 made from a different material to create an interface with the material forming the wafer carrier in the intermediate regions, such that the least two elements (inlaid region and wafer carrier itself) define at least one thermal interface therebetween in the intermediate regions. Alternatively, the intermediate regions 320 may be formed from sandwiched regions (see, for example, FIGS. 4 and 5) which form an interface both above and below with the material forming the wafer carrier in the intermediate regions. As a result, the thermal conductance of the wafer carrier substantially equalized between the two different regions. Thus, in regions where there is no wafer carrier (intermediate region 320), a first vertical line 322 normal to the first surface 360 and second surface 365 of the wafer carrier 300, drawn through the wafer carrier, has at least one interface 355 with an inlaid material 350. In regions where there is a wafer in the wafer carrier (wafer carrying regions 330), a second vertical line 325 shows a wafer-wafer carrier interface 345 between the wafer itself 340 and the wafer carrier 300 at the wafer compartment 335.

Figure 3B:
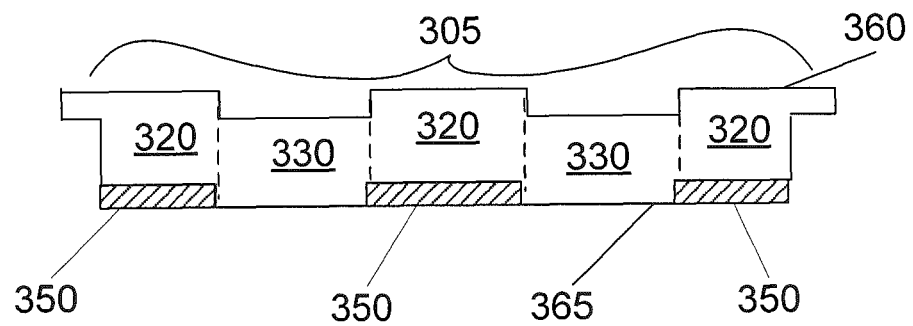
FIG. 3B shows one embodiment of a unitary main body of the multiple wafer carrier of FIG. 3A divided into regions with no wafer compartment and regions with a wafer compartment.

FIG. 3B shows one embodiment of a unitary main body 305 of the multiple wafer carrier 300 of FIG. 3A divided into regions with no wafer compartment and regions with a wafer compartment. Preferably, the body of the wafer carrier 300 is composed of a unitary main body 305 that defines both the first surfaces 360 and second surfaces 365 of the wafer carrier. The main body 305 preferably extends into the intermediate (non wafer-carrier) regions 320 so that one of the two elements that forms a thermal interface in the intermediate regions 320 is the unitary main body, and the other element is an inlaid or intermediate material 350. Similarly, the unitary main body preferably defines the first surface 360 in the intermediate regions 320, and substantially the second surface 365 in the wafer-carrying regions 330.

Figure 4:
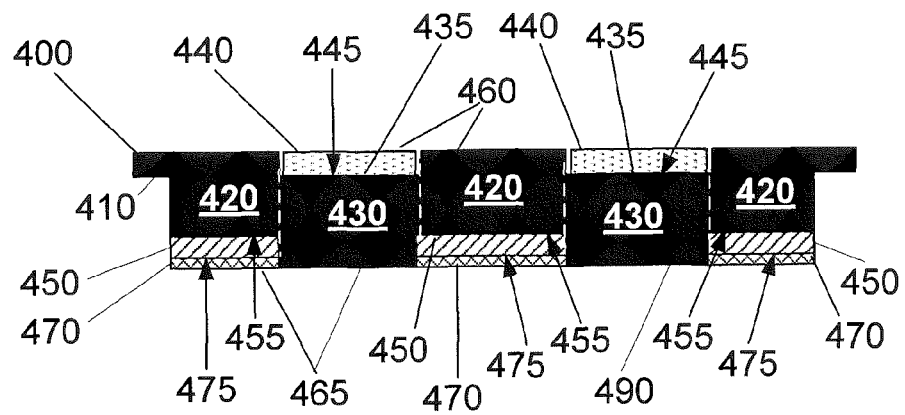
FIG. 4 shows one schematic cross-sectional view of one embodiment of a multiple wafer carrier of the present invention including a double layer of inlaid interface material.

FIG. 4 shows one schematic cross-sectional view of one embodiment of a multiple wafer carrier of the present invention including an intermediate layer of interface material. The wafer carrier 400 includes, in this embodiment, wafer carrier tabs 410, a set of first regions (intermediate regions) 420 where no wafer compartment 435 is present, and a set of second regions (wafer receiving regions) 430 where wafer compartments 435 are present. As before, a wafer substrate 440 is placed in the wafer carrier 400 in wafer compartments 435 creating a wafer-wafer carrier interface 445. The wafer carrier includes a top surface 460 and a bottom surface 465. On the bottom surface, as with previous embodiments, an inlaid material 450 is provided and forms an interface 455 with the wafer carrier 400 while creating a planar surface with the bottom surface 465 in the intermediate regions 420 of the wafer carrier 400.

In this embodiment, the inlays in the regions of the wafer carrier not including wafer compartments consist of multiple layers of materials. A first inlaid material 450 and a second inlaid material 470 are both inlaid in the regions of the bottom surface 465 of the wafer carrier 400. As a result, the a first interface 455 is created between the first inlaid material 450 and the wafer carrier 400, and a second interface 475 is created between the first inlaid material 450 and the second inlaid material 470.

The first inlaid material 450 and the second inlaid material 470 are again principally placed in the region of the wafer carrier not containing wafer compartments 420. Alternatively, the first inlaid material 450 and second inlaid material 470 are placed inlaid on the bottom surface 465 of the wafer carrier in a pattern substantially the negative of the pattern of wafer compartments 435 on the top surface 460 of the wafer carrier 400, as shown by the inverse patterns of, for example, FIGS. 9A and 9B. In the wafer-carrying regions 430, the main wafer carrier material 490 forms at least part of the bottom surface 465 of the wafer carrier.

In addition, the first inlaid material 450 and second inlaid material 470 are preferably different materials, either differing in chemical composition, alloy percentages, or, alternatively, they may be similar compositions but with different enrichments, relative metal percentages, or weights. Alternatively, they may be the same material but with a material interface between the two elements. The different materials, and the multiple interfaces 455 and 475, result in a relative reduction in heat conductivity in the regions of the wafer carrier with no wafer compartments, which may reduce edge effects, overheating, or underheating of particular regions of wafers placed in the wafer carrier.

Figure 5:
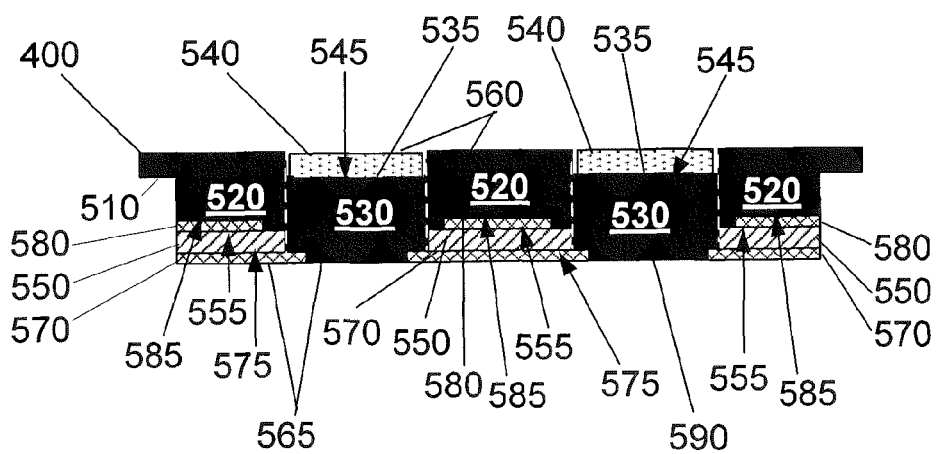
FIG. 5 shows one schematic cross-sectional view of one embodiment of a multiple wafer carrier of the present invention including a triple layer of inlaid interface material.

FIG. 5 shows one simplified schematic cross-sectional view of one embodiment of a multiple wafer carrier of the present invention including a triple layer of inlaid interface material. In this example, a third layer of inlaid material is placed in the regions of the bottom surface of the wafer carrier forming a pattern substantially the negative of the pattern of wafer compartments on the top surface of the wafer carrier.

The third material 580 creates a third material interface 585. The third material 580 may be different than the wafer carrier 500 material, first inlaid material 550 and second inlaid material 570, or, alternatively, the third material 580 may be the same as one of the other materials, so long as the resulting interfaces 555, 575 and 585 each create discontinuities between materials at each material interface (whether or not the interface is between different materials or the same material). Moreover, each of the material layers may be in a different pattern, such that not all of the inlaid material layers need be in a pattern that is exactly the negative of the pattern of wafer compartments on the top surface of the wafer carrier.

Furthermore, while the inlaid materials 550, 570 and/or 580 on the bottom surface 565 of the wafer carrier 500 are generally within the first regions 520 where there are no wafer compartments, they do not need to stay exactly within the first regions 520. For example, the first inlaid material 550 has an interface with the wafer carrier for the first regions 520 but not the second regions 530. The second inlaid material 570 has an interface with the wafer carrier for less than all of the first regions 520 and none of the second regions 530, and the third inlaid material 580 has an interface with the wafer carrier for all of the first regions 520 and a small portion of the second regions 530. As such, the inlaid materials stay substantially within the first region and outside the second region, but the boundaries of each can be varied while maintaining advantageous uniform heating characteristics. Thus, for example, the inlaid material can substantially cover the first regions even though it does not typically cover about 2-4 mm of the edge of the first region where the thermal gradient and bulk material properties may interfere: thus, for 2 to 6 inch (50.8 mm to 152.4 mm) wafers, the overlap of the inlaid material over the first region is preferably in approximately the 2-4 mm range (about 2 mm for 2 inch (50.8 mm) wafers and about 4 mm for 6 inch (152.4 mm) wafers.

Alternatively, as the inlaid materials on the bottom surface 565 follow a pattern the reverse of the pattern of wafer compartments 535 on the top surface 560 of the wafer carrier, the patterns need not be exactly the reverse of one another, but may vary relative to one another by approximately, for example, in one embodiment, 5-10% or more, or, for example, as much as 10-25% in another embodiment. In the wafer-carrying regions 530, the main wafer carrier material 590 forms at least part of the bottom surface 565 of the wafer carrier.

Figure 6:
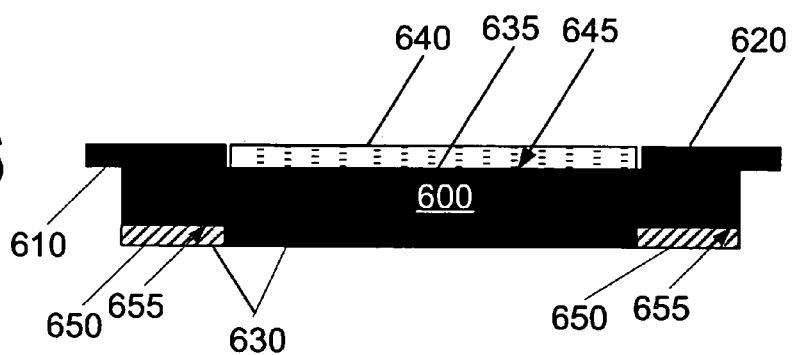
FIG. 6 shows one schematic cross-sectional view of one embodiment of a single wafer carrier of the present invention including a single layer of inlaid interface material.

FIG. 6 shows one schematic cross-sectional view of one embodiment of a single wafer carrier of the present invention including a single layer of inlaid interface material. A modified single wafer carrier 600 includes a wafer carrier tab 610, a top surface 620, and a bottom surface 630. The top surface 620 includes a wafer compartment 635 inlaid therein, and an inlaid material 650 in the bottom surface 630. The inlaid material 650 creates an inlaid material-wafer carrier interface 655. Thus, a wafer 640, when placed in the wafer compartment 635, creates a wafer-wafer carrier interface 645 between the wafer material and the material of the wafer carrier.

Figure 7:
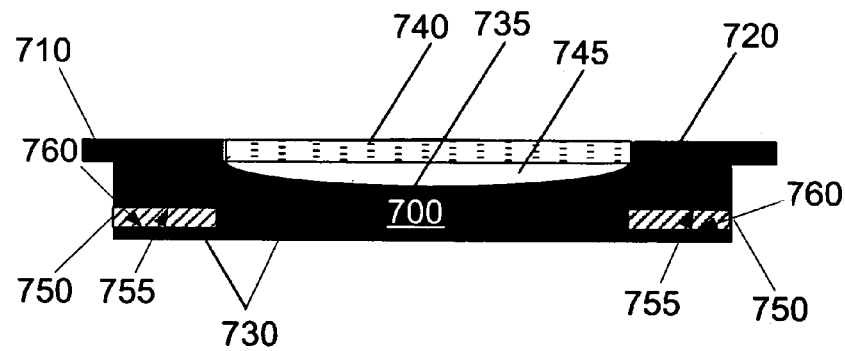
FIG. 7 shows one schematic cross-sectional view of one embodiment of a single wafer carrier of the present invention including a single layer of an intermediate inlaid interface material and a modified wafer compartment.

FIG. 7 shows one schematic cross-sectional view of one embodiment of a single wafer carrier of the present invention including a single layer of an intermediate inlaid interface material, further including a modified wafer compartment. A modified single wafer carrier 700 includes a top surface 720, a bottom surface 730, and a wafer compartment 735 inlaid on the top surface 720 adjacent to the optional wafer carrier tabs 710 on the outer edge of the top surface 720 of the wafer carrier 700. The wafer compartment 735 forms a modified concave bottom gap 745 to further mediate heat transfer from the wafer carrier to a wafer 740 placed therein in lieu of a material-material interface. At the bottom surface 730, an intermediate inlaid material 750 inlaid therein. In this embodiment, the intermediate inlaid material is inlaid within the wafer carrier 700 and is not in contact with the bottom surface 730 of the wafer carrier 700. Instead, the intermediate inlaid material 750 creates two inlaid material-wafer carrier interfaces 755 and 760.

Thus, a wafer 740, when placed in the wafer compartment 735, no longer creates a wafer-wafer carrier interface between the wafer material and the material of the wafer carrier, but rather only creates a gap 745 between the wafer 740 and the concave surface of the wafer compartment 735.

Figure 8A:
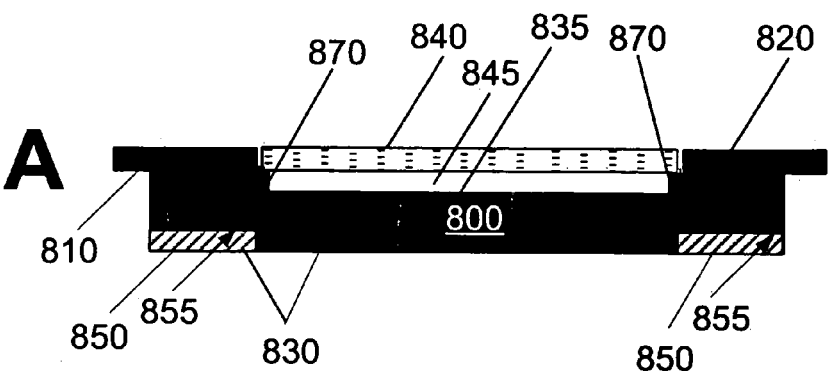
FIG. 8A shows one schematic cross-sectional view of one embodiment of a single wafer carrier of the present invention including a single layer of inlaid interface material, a modified wafer compartment, and a radial step for holding the wafer in position.

FIG. 8A shows one schematic cross-sectional view of one embodiment of a single wafer carrier of the present invention including a single layer of inlaid interface material, a modified wafer compartment, and a radial step for holding the wafer in position for holding a wafer placed therein in a "table" configuration that forms an outer rim of the wafer compartment 835. A modified single wafer carrier 800 includes a wafer tab 810, a top surface 820, and a bottom surface 830. A wafer compartment 835 is inlaid in the top surface 820. The wafer compartment 835 has a modified rectilinear deep bottom gap 845 to further mediate heat transfer from the wafer carrier to a wafer 840 placed therein, including a step 870 that reaches from the edge of the wafer compartment 835 to hold a wafer 840 when placed therein. An inlaid material 850 is inlaid in the bottom surface 830 as previously described, in a pattern negativing the pattern of the wafer compartment 835 on the top surface. The inlaid material 850 creates an inlaid material-wafer carrier interface 855. Thus, a wafer 840, when placed in the wafer compartment 835, rests upon the step 870 and no longer creates a wafer-wafer carrier interface between the wafer material and the material of the wafer carrier, as the bottom gap 845 creates air space therein. The step 870 preferably forms outer rim around the inner diameter of the wafer compartment 835 that is, in one embodiment, approximately 1-2 mm in width and 10-200 um in depth relative to the compartment 835 itself.

Figure 8B:
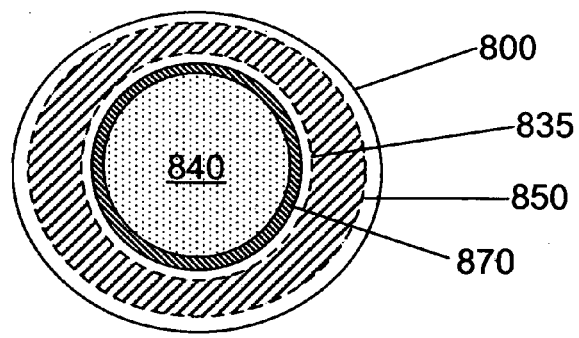
FIG. 8B shows a top-down view of one embodiment of a single wafer carrier of the present invention shown in FIG. 8A.

FIG. 8B shows a top-down view of one embodiment of a single wafer carrier of the present invention shown in FIG. 8A, with a step 870 forming an outer rim along the inner diameter of the modified wafer carrier. The wafer carrier 800 includes an inlaid region 850 of material on the bottom surface 820 (see FIG. 8A) of the wafer carrier 800. A wafer 840 is placed in wafer compartment 835, where it stands upon the step 870. Although the step 870 is shown as continuous in FIGS. 8A and 8B, it may be discontinuous and may also appear as tabs at certain locations along the inner diameter of the wafer compartment 835.

Figure 9A:
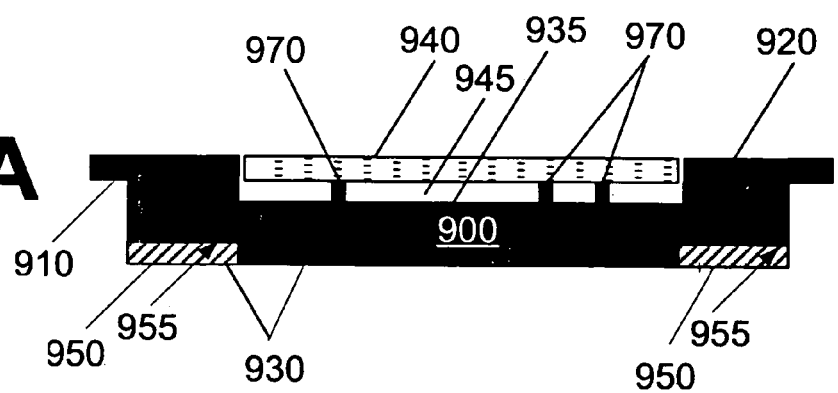
FIG. 9A shows one schematic cross-sectional view of one embodiment of a single wafer carrier of the present invention including a single layer of inlaid interface material, a modified wafer compartment, and a plurality of legs for holding the wafer in position.

FIG. 9A shows one schematic cross-sectional view of one embodiment of a single wafer carrier of the present invention including a single layer of inlaid interface material, a modified wafer compartment, and a plurality of legs for holding the wafer in position for holding a wafer placed therein in a "table" configuration. A modified single wafer carrier 900 includes a wafer tab 910, a top surface 920, and a bottom surface 930. A wafer compartment 935 is inlaid in the top surface 920. The wafer compartment 935 has a modified rectilinear deep bottom gap 945 to further mediate heat transfer from the wafer carrier to a wafer 940 placed therein, including a plurality of legs 970 that reach from the bottom gap 945 to hold a wafer 940 when placed therein. An inlaid material 950 is inlaid in the bottom surface 930 as previously described, in a pattern negativing the pattern of the wafer compartment 935 on the top surface. The inlaid material 950 creates an inlaid material-wafer carrier interface 955. Thus, a wafer 940, when placed in the wafer compartment 935, rests upon the legs 970 and no longer creates a wafer-wafer carrier interface between the wafer material and the material of the wafer carrier, as the bottom gap 945 creates air space therein.

Figure 9B:
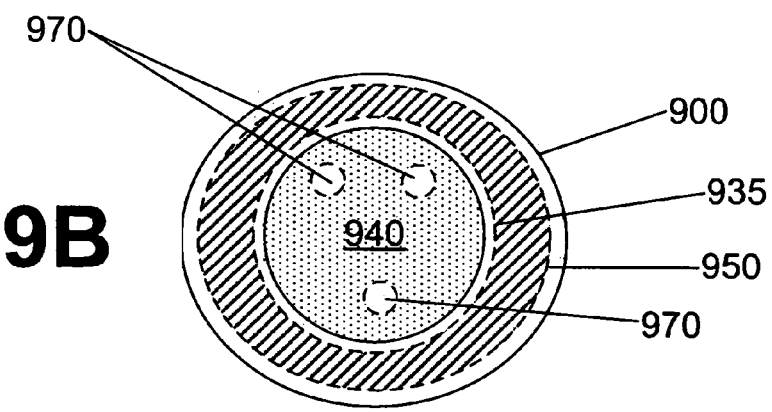
FIG. 9B shows a top-down view of one embodiment of a single wafer carrier of the present invention shown in FIG. 9A.

FIG. 9B shows a top-down view of one embodiment of a single wafer carrier of the present invention shown in FIG. 9A, with three legs in a triangular pattern holding up a wafer in the modified wafer carrier. The wafer carrier 900 includes an inlaid region 950 of material on the bottom surface 920 (see FIG. 9A) of the wafer carrier 900. A wafer 940 is placed in wafer compartment 935, where it stands upon a set of legs 970.

Figure 10A:
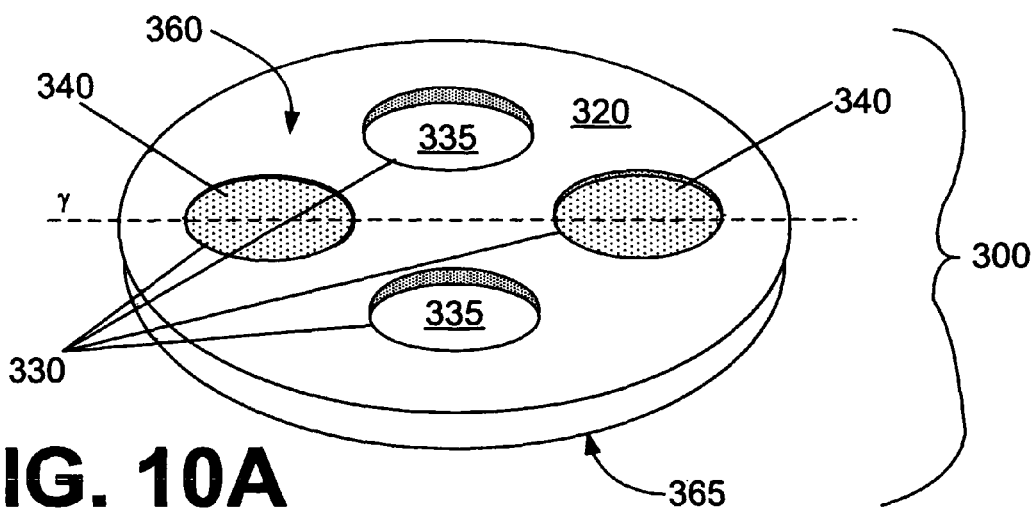
FIG 10A shows a top perspective view of one embodiment of a multiple wafer carrier of the present invention as shown in FIG. 3.
Figure 10B:
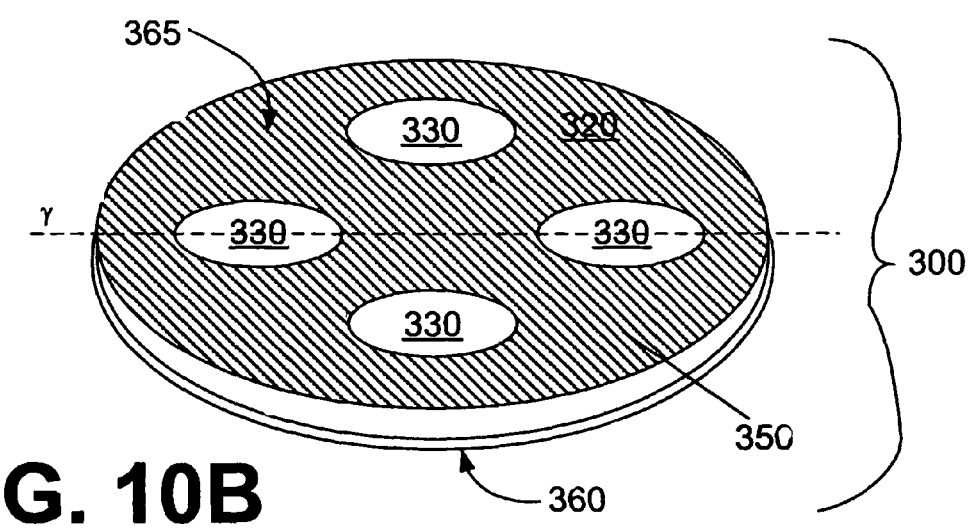
FIG. 10B shows a bottom perspective view of one embodiment of a multiple wafer carrier of the present invention as shown in FIG. 3.

FIG. 10A shows a top perspective view of one embodiment of a multiple wafer carrier of the 300 invention as shown in FIG. 3A. The multiple wafer carrier 230 of FIG. 3A includes a first pattern 330 of wafer compartments 335 on the top surface 360 of the wafer carrier 300, surrounded by a second pattern of intermediate regions 320. The bottom surface 365 is shown in FIG. 10B. Although typically each wafer compartment will hold a wafer 340, some compartments 335 are shown as empty in order to show the structure of the wafer carrier main body 305 (see FIG. 3B) when wafers are not present. Each wafer 340 sits in a respective wafer compartment 335 such that the wafers 340 are preferably substantially inlaid and flush with the top surface 360 of the wafer carrier 340, although they need not be so. A cross section shown by bisecting line (γ) of a wafer carrier such as the one shown in FIG. 10A can be seen in FIG. 3.

FIG 10B shows a bottom perspective view of one embodiment of a multiple wafer carrier of the present invention as shown in FIGS. 3 and 10A, wherein a second pattern of intermediate regions 320 is on the bottom surface 365 that is substantially the negative of the first pattern of wafer-compartment regions 330 on the top surface 360 of the wafer carrier 330. The second pattern 320 is filled with an inlaid material 350, where the inlaid material 350 is preferably different from the material from which the unitary body of the wafer carrier 300 is made. Those regions which are not part of the second pattern 320 pass through the inlaid material 350 to form a flush surface made of the same material as the rest of the unitary body of wafer carrier 300 in a pattern substantially similar to (though it need not be identical to) the first wafer-carrying region pattern 320. The edges and boundaries of the third pattern may differ from the first pattern by as much as 10-25%. A cross section shown by bisecting line (γ) of a wafer carrier such as the one shown in FIG. 10B can be seen in FIG. 3. Other patterns are foreseen, such as, for example, symmetric and asymmetric combinations of wafer compartments, single wafer carriers (FIGS. 6-9), and mosaics of wafer compartment and non-wafer compartment regions incorporating multiple wafer compartment regions with circular or non-circular wafer compartments therein, and other designs, are contemplated.

Figure 11A:
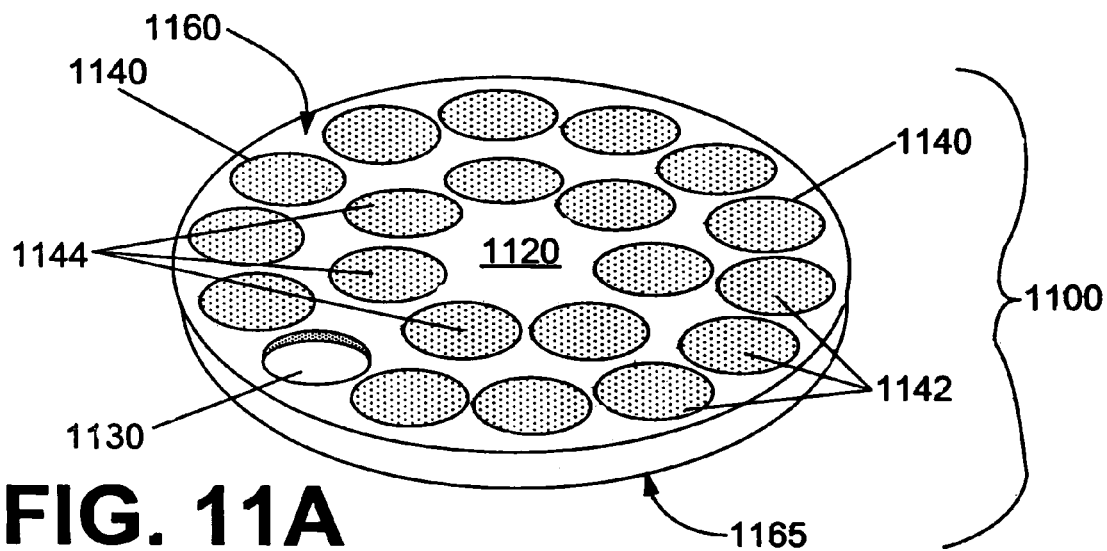
FIG. 11A shows a top perspective view of one embodiment of a multiple wafer carrier of the present invention including two rings of wafer compartments.

For example, FIG. 11A shows a top perspective view of one embodiment of a multiple wafer carrier of the present invention including two rings of wafer compartments, for use in a larger chemical vapor deposition system. The wafer carrier 1100 includes a top surface 1160 and a bottom surface 1165, wherein the top surface 1160 includes a plurality of wafer compartments 1130 and intermediate regions 1120 including portions of the top surface 1160 between and around the wafer compartments 1130. The wafer compartments 1130 are advantageously filled with wafers 1140. Moreover, the plurality of wafer compartments 1130 form a first ring 1142 and a second ring 1144 on the top surface 1160 of the wafer carrier. In this embodiment, the first ring is an outer ring including fourteen wafer compartments, and the second ring is an inner ring including seven wafer compartments, where each wafer compartment is preferably about two inches (50.8 mm). However, the pattern of wafer compartments is flexible: a larger wafer carrier including three rings — an outer, middle and inner ring of, for example, twenty-one, fourteen, and seven wafer compartments respectively, is also applicable for larger chemical vapor deposition systems, as are other geometries depending on the system on which the wafer carrier is to be implemented.

Figure 11B:
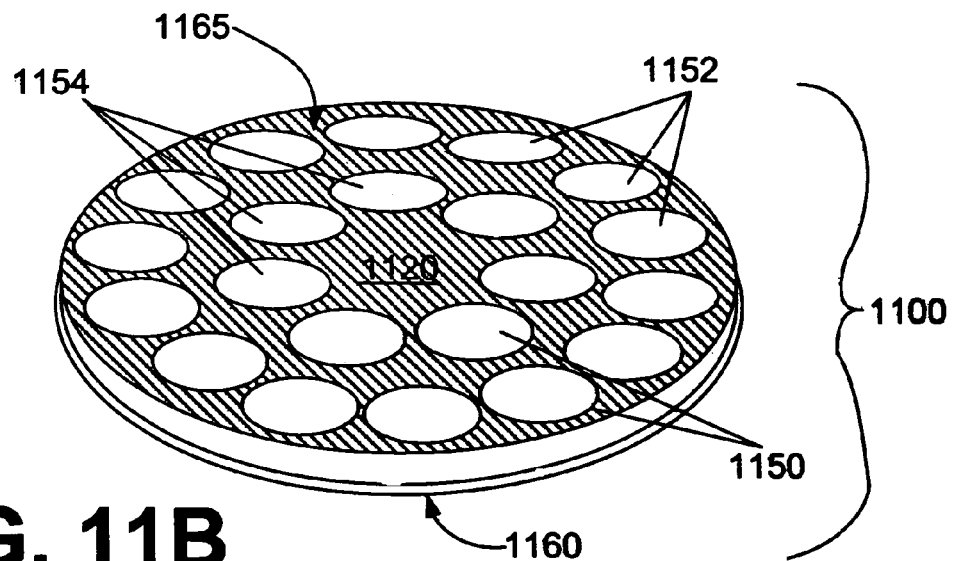
FIG. 11B shows a bottom perspective view of one embodiment of a multiple wafer carrier of the present invention including two rings of wafer compartments.

FIG. 11B shows a bottom perspective view of one embodiment of a multiple wafer carrier of the present invention including two rings of wafer compartments, as shown in FIG. 11A. The wafer carrier 1100 is shown from the opposite perspective of FIG. 11A, such that the bottom surface 1165 is visible and the top surface 1160 (see FIG. 11A) is not visible. A pattern of intermediate regions 1120 on the bottom surface 1165 that is substantially the negative of the first pattern of wafer-compartment regions 1130 on the top surface 1160 of the wafer carrier 1130. The second pattern 1120 is filled with an inlaid material, where the inlaid material is preferably, though not typically required to be, different from the material from which the unitary body of the wafer carrier 1100 is made. Those regions which are not part of the second pattern 1120 pass through the inlaid material to form a flush surface 1150 preferably made of the same material as the rest of the unitary body of wafer carrier 1100, in a pattern substantially similar to the pattern of the wafer compartments 1130 on the top surface 1160 of the wafer carrier 1100. In particular, the flush surface 1150 forms a pattern including a first ring 1152 and a second ring 1154 on the bottom surface 1165 of the wafer carrier, in approximately a mirror image to the pattern of the first ring 1142 and second ring 1144 of wafer compartments on the top surface 1160 of the wafer carrier.

As can be seen from the various designs shown herein, the geometry of a particular wafer carrier and wafer compartment can be varied as to dimensions, shape and material without departing from the concept of the invention described, as can multiple wafer compartment geometries be employed on the same wafer carrier.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A wafer carrier, comprising:
   a wafer carrier structure;
   a first surface composed of a first material of said wafer carrier structure, said first surface including a plurality of inset wafer compartments;
   a second surface disposed opposite to said first surface on said wafer carrier structure, said second surface including a layer of second material defining a solid-to-solid interface with said first material; and,
   said layer of second material comprising a discrete component covering a first region comprising substantially all of said second surface except for those regions of said second surface substantially opposite to said plurality of inset wafer compartments on said first surface, said solid-to-solid interface forming a conductance barrier between said first and second materials extending substantially over all of said first region, said conductance barrier including discontinuities between said first and second materials at said solid-to-solid interface.

2. The wafer carrier of claim 1, wherein said first material covers substantially all of said regions of said second surface substantially opposite to said plurality of inset wafer compartments on said first surface.

3. The wafer carrier of claim 1, wherein said first material is selected from the one or more of: graphite, SiC, AlN, $Al_2O_3$, Molybdenum, Tungsten, and mixtures or alloys thereof, with or without surface coatings.

4. The wafer carrier of claim 3, wherein said second material is selected from one or more of: graphite, SiC, AlN, $Al_2O_3$, Molybdenum, Tungsten, and mixtures or alloys thereof, with or without surface coatings.

5. The wafer carrier of claim 1, where said second surface is planar, said first surface is planar except for said inset wafer compartments, and said inset wafer compartment includes a step-wise outer rim for seating a wafer thereon.

6. The wafer carrier of claim 1, wherein said second material is comprised of a plurality of layers of materials at least one of which is distinct from said first material.

7. The wafer carrier of claim 1, wherein the first and second materials have bulk conductivities which are substantially the same.

8. The wafer carrier of claim 1, wherein the first and second materials are the same material.

9. The wafer carrier of claim 1, wherein the second surface is substantially flat over the entire second surface.

10. A wafer carrier, comprising:
a wafer carrier structure,
a first surface with a first pattern of wafer compartments therein, said first surface composed of a first material of said wafer carrier structure; and,
a second surface disposed opposite to said first surface on said wafer carrier structure, said second surface having a second pattern of second material disposed therein, where said second pattern of second material is substantially the reverse of said first pattern of wafer compartments, wherein said second pattern of second material comprises a discrete component defining a solid-to-solid interface with said first material, said solid-to-solid interface forming a conductance barrier between said first and second materials contiguous with said second pattern, said conductance barrier including discontinuities between said first and second materials at said solid-to-solid interface.

11. The wafer carrier of claim 10 wherein said first material reaches said second surface substantially in said first pattern, and said second material is inlaid in said second surface substantially in said second pattern.

12. The wafer carrier of claim 11, wherein said first surface is planar except for said wafer compartments.

13. The wafer carrier of claim 12, wherein said wafer compartment includes a step-wise outer rim for seating a wafer thereon.

14. The wafer carrier of claim 11, wherein said wafer compartments have a shape therein for seating a wafer therein selected from the shapes of concave, sawtooth, a step, and a plurality of legs.

15. The wafer carrier of claim 10, wherein said second material is comprised of a plurality of layers of materials at least one of which is different from said first material.

16. The wafer carrier of claim 10, wherein said first material is selected from one or more of: graphite, SiC, AlN, $Al_2O_3$, Molybdenum, Tungsten, and mixtures or alloys thereof, with or without surface coatings.

17. The wafer carrier of claim 16, wherein said second material is selected from one or more of is selected from one or more of: graphite, SiC, AlN, $Al_2O_3$, Molybdenum, Tungsten, and mixtures or alloys thereof, with or without surface coatings.

18. The wafer carrier of claim 10, wherein the wafer compartments form a ring pattern on the top surface of the wafer carrier.

19. The wafer carrier of claim 18, wherein the wafer compartments form a plurality of ring patterns on the top surface of the wafer carrier.

20. The wafer carrier of claim 10, wherein the first and second materials have bulk conductivities which are substantially the same.

21. The wafer carrier of claim 10, wherein the first and second materials are the same material.

22. The wafer carrier of claim 10, wherein the second surface is substantially flat over the entire second surface.

23. A chemical vapor deposition reactor, comprising:
a reactor chamber, said reactor chamber including a set of chamber walls defining an inside and an outside of the chamber, a top and a bottom;
a gas head disposed into said reaction chamber for providing gasses to the chamber from at least one external gas source;
a heating element disposed within said chamber;
a wafer carrier disposed on a susceptor, comprising a first surface with a first pattern of wafer compartments therein, said first surface composed of a first material, a second surface disposed opposite to said first surface, said second surface having a second pattern of inlaid second material disposed therein, where said second pattern of inlaid second material is substantially the reverse of said first pattern of wafer compartments, said second pattern of second material comprising a discrete component defining a solid-to-solid interface with said first material, said solid-to-solid interface forming a conductance barrier between said first and second materials contiguous with said second pattern, said conductance barrier including discontinuities between said first and second materials at said solid-to-solid interface; and,
a support upon which said heating element and wafer carrier are disposed within said chamber.

24. The reactor of claim 23, wherein said regions of said second surface not part of said second pattern are substantially covered with said first material.

25. The reactor of claim 23, wherein said wafer carrier first surface is planar except for said wafer compartments.

26. The reactor of claim 23, wherein said inlaid second material of said wafer carrier is comprised of a plurality of layers of materials at least one of which is different from said first material of said wafer carrier.

27. The reactor of claim 23, wherein said wafer carrier first material is selected from one or more of:
graphite, SiC, AlN, $Al_2O_3$, Molybdenum, Tungsten, and mixtures or alloys thereof, with or without surface coatings.

28. The reactor of claim 23, wherein said wafer carrier second material is selected from one or more of:
graphite, SiC, AlN, $Al_2O_3$, Molybdenum, Tungsten, and mixtures or alloys thereof, with or without surface coatings.

29. The reactor of claim 23, wherein said wafer compartment includes a step-wise outer rim for seating a wafer thereon.

30. The reactor of claim 29, wherein the step-wise outer rim of said wafer compartment is between 1-2 millimeters in width and between 10 and 100 microns in depth.

31. The reactor of claim 23, wherein the first pattern of wafer compartments is a set of concentric rings of wafer compartments.

32. The reactor of claim 23, wherein the first and second materials have bulk conductivities which are substantially the same.

33. The reactor of claim 23, wherein the first and second materials are the same material.

34. The reactor of claim 23, wherein the second surface is substantially flat over the entire second surface.

35. A wafer carrier comprising a structure defining oppositely-directed first and second surfaces, said structure including wafer-receiving regions and intermediate regions, said structure being adapted to receive wafers on said first surface in said wafer-receiving regions, said intermediate regions having thermal conductance between said first and second surfaces lower than the thermal conductance between said first and second surfaces of said wafer-receiving regions, wherein said structure includes at least two solid elements defining at least one solid-to-solid interface therebetween extending substantially over all of said intermediate regions, said solid-to-solid interface forming a conductance barrier between the at least two elements, said conductance barrier including discontinuities between said first and second materials at said solid-to-solid interface.

36. A wafer carrier as claimed in claim 35 wherein said structure includes a unitary main element defining both said first and second surfaces in said wafer-receiving region.

37. A wafer carrier as claimed in claim 36 wherein said unitary main element extends into said intermediate regions and said at least two elements include said unitary main element.

38. A wafer carrier as claimed in claim 37 wherein said unitary main element defines said first surface of said intermediate regions.

39. A wafer carrier as claimed in claim 37 wherein said at least two elements include a second element having a different composition from said unitary main element, said second element defining at least part of said second surface in said intermediate regions.

40. The wafer carrier of claim 39, wherein said unitary main element is formed from one or more of: graphite, SiC, AlN, $Al_2O_3$, Molybdenum, Tungsten, and mixtures or alloys thereof, with or without surface coatings, and said second element is formed from one or more of: graphite, SiC, AlN, $Al_2O_3$, Molybdenum, Tungsten, and mixtures or alloys thereof, with or without surface coatings.

41. The wafer carrier of claim 36, wherein the wafer-receiving regions form a pattern of concentric rings on the unitary main element.

42. The wafer carrier of claim 35, wherein the at least two solid elements have bulk conductivities which are substantially the same.

43. The wafer carrier of claim 35, wherein the at least two solid elements are comprised of the same material.

44. The wafer carrier of claim 35, wherein the second surface is substantially flat over the entire second surface.

\* \* \* \* \*